(12) United States Patent
Hau

(10) Patent No.: US 7,518,446 B2
(45) Date of Patent: Apr. 14, 2009

(54) MULTI-MODE POWER AMPLIFIER WITH REDUCED LOW POWER CURRENT CONSUMPTION

(75) Inventor: Gary Hau, Merrimack, NH (US)

(73) Assignee: Fairchild Semiconductor Corporation, South Portland, MA (US)

( * ) Notice: Subject to any disclaimer, the term of this patent is extended or adjusted under 35 U.S.C. 154(b) by 157 days.

(21) Appl. No.: 11/385,948

(22) Filed: Mar. 21, 2006

(65) Prior Publication Data
US 2007/0222508 A1 Sep. 27, 2007

(51) Int. Cl.
*H03F 1/14* (2006.01)
(52) U.S. Cl. .................. 330/51; 330/302; 330/310
(58) Field of Classification Search ............ 330/51, 330/133, 151, 302, 310
See application file for complete search history.

(56) References Cited
U.S. PATENT DOCUMENTS

| 6,900,692 | B2 |   | 5/2005 | Kim et al. |        |
|-----------|----|---|--------|------------|--------|
| 6,972,618 | B2 | * | 12/2005| Kim et al. | 330/51 |
| 7,023,270 | B2 | * | 4/2006 | Kim et al. | 330/51 |
| 2003/0222709 | A1 | | 12/2003 | Kim |  |
| 2004/0130391 | A1 | | 7/2004 | Kim et al. |  |

OTHER PUBLICATIONS

Okazaki H. et al.: "Efficient Transmission-Power-Control Scheme for User Earth Terminals" IEEE Transcations on Microwave Theory and Techniques, IEEE Service Center, Piscataway, NJ, US vol. 49, No. 6, Part 2, Jun. 2001, pp. 1167-1173, ISSN: 0018-9480.
Notification of Tramsmittal of the International Search Report and the Written Opinion of the International Searching Authority, or the Declaration, PCT/US2007/006766, filed on Mar. 19, 2007, applicant: Gary Hau.

* cited by examiner

*Primary Examiner*—Khanh V Nguyen
(74) *Attorney, Agent, or Firm*—Cesari and McKenna, LLP; Edwin H. Paul, Esq.

(57) ABSTRACT

A multi-mode RF amplifier is disclosed having high and low output power modes composed of two power paths. When the multi-mode RF amplifier is biased into the high power, HP, mode, substantial power is delivered via both (first and second) paths. While in the low power, LP, mode, power is delivered via second path only which is designed to reduce current consumption and improve efficiency under low power (backoff) operation. The multi-mode RF amplifier has power amplifiers in one embodiment, but no mechanical or electronic switches. The multi-mode amplifier utilizes impedance matching circuits where the impedances change under different power amplifier bias conditions in order to optimize current consumption under both modes of operations and is power efficient for portable applications. Note that, in a preferred embodiment, even in the HP mode more power is delivered to the second power path than to the first power path.

10 Claims, 6 Drawing Sheets

|  LP |  HP |
| --- | --- |
| 12 — ZintL << ZintH | ZintL >> ZintH — 10 |
| 20 — PL >> PH | PL << PH — 22 |
| 18 — ZPA(LP) | >> ZPA(HP) |
| 14 — ZintH(LP) | >> ZintH(HP) |
| 16 — ZintL(LP) | << ZintL(HP) |

|     | KIM | | INV |
|---|---|---|---|
| LPM | $Z_{intH} \gg Z_{intL}$<br>$P_L \gg P_H$ | 58<br>60 | $Z_{int1} < Z_{int2}$<br>$P_2 > P_1$ |
| HPM | $Z_{intH} \ll Z_{intL}$<br>$P_L \ll P_H$ | 62<br>64 | $Z_{int1} > Z_{int2}$<br>$P_2 > P_1$ |
|  | $Z_{PA(LP)} \gg Z_{PA(HP)}$ | 66 | $Z_{in2(LP)} > Z_{in2(HP)}$ |
|  | $Z_{intH(LP)} \gg Z_{intH(HP)}$ | 68 | $Z_{int1(LP)} > Z_{int1(HP)}$ |
|  | $Z_{intL(LP)} \ll Z_{intL(HP)}$ | 70 | $Z_{int2(LP)} \gg Z_{int2(HP)}$ |
|  |  | 72 | $Z_{out1(LP)} \gg Z_{out1(HP)}$ |
| INV | | 74 | $|\mathrm{PHASE}\ Z_{int1(LP)} - \mathrm{PHASE}\ Z_{int2(LP)}| \sim 180°$ |

FIG. 7

|        | LP                     | HP                      |
|--------|------------------------|-------------------------|
| $Z_{int1}$ | 80 — $2.4 - 27\,j\Omega$ | 84 — $15.7 - 12.6\,j\Omega$ |
| $Z_{int2}$ | 82 — $57 + 36.4\,j\Omega$ | 86 — $7.6 + 2.9\,j\Omega$ |
| $Z_{in2}$  | $3.1 - 8.7\,j\Omega$    | $1.5 - 1.9\,j\Omega$    |
| $Z_{out1}$ | $14.9 - 26.9\,j\Omega$  | $6.2 - 0.4\,j\Omega$    |

FIG. 8

MULTI-MODE POWER AMPLIFIER WITH REDUCED LOW POWER CURRENT CONSUMPTION

CROSS REFERENCE TO RELATED PATENTS

The present application is related to the commonly owned U.S. patent application Ser. No. 11/350,220, filed Feb. 8, 2006, and entitled: Power Amplifier with Close-Loop Adaptive Voltage Supply, by Hau et al. This earlier application is hereby incorporated herein by reference.

BACKGROUND OF THE INVENTION

1. Field of the Invention

The present invention relates to power amplifiers and, more particularly, to power amplifiers used in battery powered mobile handsets, and even more particularly to optimizing battery current use in such power amplifiers over a range of output power levels.

2. Background Information

Radio-frequency (RF) signals generated at a mobile handset generally are amplified, transmitted through the handset antenna and sent to a base station for distribution to receivers. Often the frequency bands of operation of the handsets are predetermined, mainly in the frequency range from 800 MHz to 2000 MHz for various mobile standards such as WCDMA (wide band code division multiple access) and CDMA (code division multiple access). The present invention, however, may find advantageous use in device operating at other frequencies and with other formats.

In general, the handset is required to transmit at a high output power level when it is farther away from a receiving base station in order to maintain a pre-determined signal strength at the base station for sufficient reception. Conversely, the closer the handset to the base station, less transmitted power would be required. The handset output power is adjusted according to the command embedded within the RF control signal transmitted from the base station to the handset.

The handset transmitted signal, and hence the RF power amplifier output signal, has to meet the FCC regulation on spectral re-growth (also known as linearity—often measured in terms of adjacent channel leakage power ratio (ACLR) which stipulates the maximum allowable interference to other frequency channels in order to minimize interference between signals). Some known mobile devices (handsets) have RF power amplifiers powered by the full battery voltage at all times. The RF power amplifies are generally designed to meet the linearity specification at maximum transmit power level (+28 dBm for WCDMA system) under such a bias condition. Statistically, power amplifiers transmits at maximum linear output power only for a small fraction of time, while most of the transmissions take place at a considerably lower power levels (10-20 dB below maximum power). The power added efficiency (PAE, a metric known in the art) of the power amplifiers usually drops off rapidly at backoff power, resulting in non-optimal current consumption coupled with excessive linearity margin. As known to those skilled in the art, the excessive linearity margin can be a trade-off for lower current consumption in the design of power amplifiers.

The actual output power level from the power amplifier (and hence the handset), is continuous from some −50 dBm to 28 dBm. High Power (HP) and Low Power (LP) modes are known in the art as part of the PA functions. The HP generally applies to the range from 16 dBm to 28 dBm, and LP to power levels below 16 dBm. Use of HP and LP modes further improves efficiency in the low power range as compared to a conventional PA.

The above cross referenced application describes an invention which provides a reasonably continuous measurement of output power required from a predetermined optimum relationship, that is defined therein. Also defined in this earlier application is the linearity relationship and adjacent channel interference as determined by the FCC. This earlier application provides the required optimum current consumption at each output power by varying the bias power supply to the power amplifiers. These relationships are well described in the prior art, the incorporated application and the U.S. patent Kim discussed below. Thus, later references to these relationships are made without detail.

U.S. Pat. No. 6,900,692 B2 to J. Kim et al., (Kim) discloses a system that optimizes the current consumption of the power amplifier at two discrete power output levels, i.e. the maximum output power at LP and HP modes operation. This patent is incorporated herein by reference. Kim describes earlier art, with respect to its invention, that incorporates switches (electronic and/or actual mechanical switches with pole pieces) into the power amplifier design where two different parallel signal paths are utilized, one for the LP and one for the HP mode. However, any such switches are lossy, costly, several must be used to provide bypassing, and complex control may be required. Increased power loss and current consumption and large physical size all limit the applications of such circuits in handset power amplifiers.

Kim's advance over the described prior art provides a two path power amplifier with a low power (LP) and a high power (HP) mode without switches. In the low power mode the high power path is disabled and a bypass circuit carries the low power to the output. Kim describes a circuit that reduces power consumption (and therefore extends battery life) in the low power mode and provides higher PAE (power added efficiency). PAE is a metric term known to those skilled in the art. Kim provides parallel impedance matching/transforming circuits that define two paths to the RFout, one for HP and one for LP operation. Kim's inventive circuitry (See Kim's FIGS. 5 and 6) is reproduced herein as FIG. 1. When high power is required, the Voltage Control 2 will provide a control signal to turn on the PA for signal amplification. When in the low power mode, the Voltage Control 2 will provide a control signal to turn off the PA. Kim's FIG. 8 illustrates a voltage control circuit that provides the on/off control to Kim's driver and power stage.

FIG. 2 details the impedances and power delivered by Kim in the HP and LP modes. In the HP mode, the PA is active and Kim provides an impedance ZintL that is significantly higher 10 than ZintH, so that the power, PH, delivered to the $2^{nd}$ impedance matching circuit is much higher 22 than the power, PL, delivered to the Ztrans, an impedance transformer. The PA amplifies the signal and provides, via the $3^{rd}$ and $4^{th}$ impedance matching circuits, a high power RF out. In the LP mode the opposite occurs, the PA is biased off, and ZintH is significantly higher 12 than ZintL, and PL is much higher 20 than PH. Kim details that the "significantly higher" impedance level means two times (or more) larger.

So Kim discloses and requires the relationships as shown in FIG. 2. That is: a) when in LP mode, ZintL is much lower 12 than ZintH; b) when in HP mode, ZintL is much higher 10 than ZintH; and c) ZintH in LP mode is much higher 14 than ZintH in HP mode, d) ZintL in LP mode is much lower 16 than ZintL in HP mode; and e) ZPA, the input impedance of the PA, in LP mode is much higher 18 than ZPA in HP mode. As evidenced in FIG. 1, Kim, via the voltage control 2, controls the on/off characteristics of the PA depending on the mode of operation. In doing so the impedance characteristics of ZintH and ZintL change due to the change in the input and output impedance level of the PA. So in the HP mode, the PA is biased on and ZintH impedance is much lower than ZintL and most power travels through the PA. In the LP mode, the input and output impedances of the PA change when it is turned off, which increases ZintH and decreases ZintL so that more power travels through Ztrans. Moreover, the change in output impedance of the PA in the LP mode affects the $3^{rd}$, $4^{th}$ and Ztrans impedance. These impedance networks are designed to minimize the power leakage through the $3^{rd}$ matching circuit to the PA. Implementing these techniques are known to those skilled in the art. Limitations in Kim can be found directly from FIG. 1. For example, Kim's five impedance matching circuits are complex and several simultaneous matching requirements under HP and LP modes would require tradeoffs in performances. In Kim's HP mode operation, Ztrans is designed in conjunction with the $3^{rd}$ and $4^{th}$ impedance networks to increase ZintL. While under LP mode operation, these three impedance matching networks are required to reduce ZintL. If the matching networks are optimized for the best ZintL under LP mode operation, it might not be optimal under HP mode operation which would increase undesired leakage power through Ztrans and degrade HP mode performance. On the other hand, if the matching networks are optimized for the best ZintL under HP mode operation, then ZintL might not be optimal under LP mode operation which could increase the current consumption of the driver stage.

Moreover, Kim describes his power amplifier system where, in the HP mode, the power leakage into Ztrans is minimized, and most of the power from the driver stage will be amplified by the PA. This operation is similar to the conventional power amplifiers where the final stage delivers the output power and consumes majority of the current, and therefore operates at a much higher thermal temperature than the driver stage.

FIG. 3 illustrates typical PAE of a power amplifier operating in a single power mode. It is evident that in the back-off or low power range, PAE is very low. FIG. 4 shows operation of a system with two power level modes, as in Kim and as might be used with the present invention. Here it is clear that PAE is improved in the LP mode.

The prior art, generally, remains power inefficient due to potential tradeoffs required for matching impedances for HP and LP modes, and the prior art also employs complex circuitry.

SUMMARY OF THE INVENTION

The present invention provides a multi-mode RF power amplifier that addresses limitations in the prior art and provides advantages with respect to the prior art. In one embodiment, the inventive multi-mode amplifier includes two paths both suitable for delivering RF power to an output. A first path includes, in order, a first power amplifier, a first impedance matching circuit, a second power amplifier and a second impedance matching circuit coupled to an output delivering RF power. The second path includes, in order, the first power amplifier, a bypass impedance matching circuit, and the second impedance matching circuit. The bypass impedance matching circuit parallels the first impedance matching circuit and the second power amplifier.

In an embodiment, the multi-mode RF power amplifier assumes at least two operating modes, the first being the HP (higher power) output mode and the second mode being the LP (lower power) output mode. Note that power travels through both paths, described above, in the HP mode, but only through the bypass path in the LP mode. In the HP mode, the input impedance of the first and the bypass impedance matching circuits are about equal so that power delivered from the first power amplifier is about equally delivered to both the first and bypass impedance matching circuits. But, in preferred embodiments, the power delivered to the bypass circuit is larger than that delivered to the second power amplifier. The result is that substantial power travels through both paths and both contribute to the final HP output. Since the power delivered in the HP mode is shared between the two paths, it becomes unnecessary to minimize any power leakage to the bypass impedance matching circuit as described in Kim. The advantages of this operation are the elimination of any impact on high power performance due to power leakage, and its associated requirement for the simultaneous match from the bypass matching circuit under both modes of operations.

In an example illustrating the invention, when the multi-mode RF power amplifier is in the LP mode, the input impedance of the first and the bypass impedance matching circuits are substantially different, with substantially more power being delivered to the bypass impedance matching circuit, and the second power amplifier is biased off.

In a preferred embodiment, the power delivered to the bypass impedance matching circuits is greater than the power delivered to the first impedance matching circuit in both the HP and the LP modes.

The multi-mode RF power amplifier is placed, in a preferred embodiment, in one or the other mode by changing the biasing to the first and the second power amplifiers. By changing this biasing, the complex impedances of the first and the bypass impedance matching circuits change from about equal to complex impedances that exhibit about 180 degrees phase difference.

The multi-mode RF power amplifier when in the HP mode, and although the input impedances of the first and the bypass impedance matching circuits are about equal, in a preferred embodiment, input impedance of the first matching circuit is greater than the input impedance of the bypass impedance matching circuit, but less than the input impedance of the bypass impedance matching circuit in the LP mode. The optimum load impedance presented to the first power amplifier, through the parallel combination of the first and the bypass impedance matching circuits, is lower in the HP mode than the LP mode. This impedance requirement is a result of different output power capability required from the first power amplifier in the different modes of operation.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which:

FIG. 7 is a table of impedances and power comparing prior art Kim and the present invention;

FIG. 8 is a table of specific impedances of the present invention at 1.95 GHz;

DETAILED DESCRIPTION OF AN ILLUSTRATIVE EMBODIMENT

Figures 1, 2:
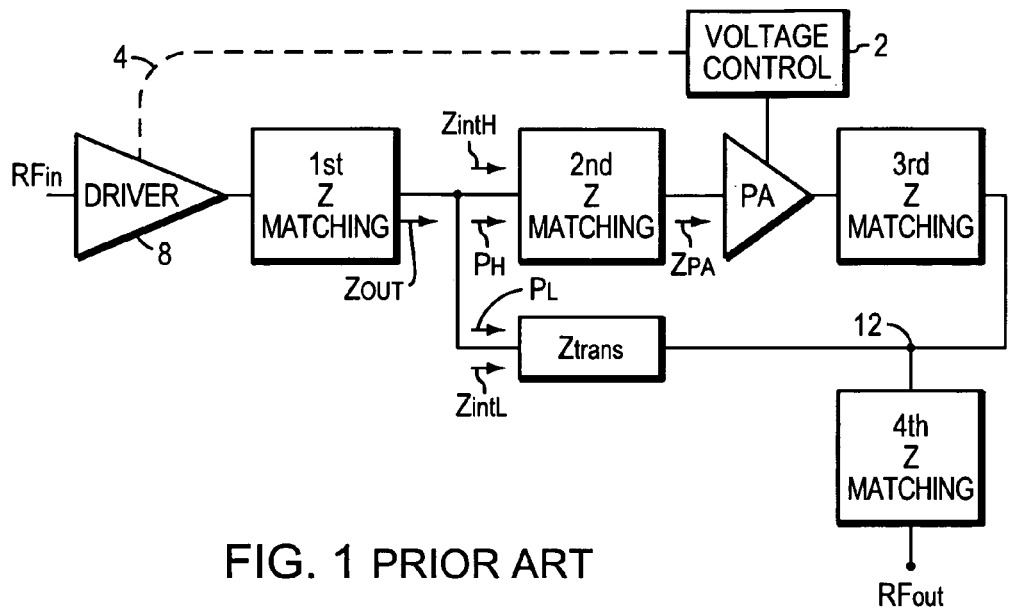
FIG. 1 is a prior art (Kim) circuit block diagram.
FIG. 2 shows relationships required in the circuit of FIG. 1.
Figure 5:
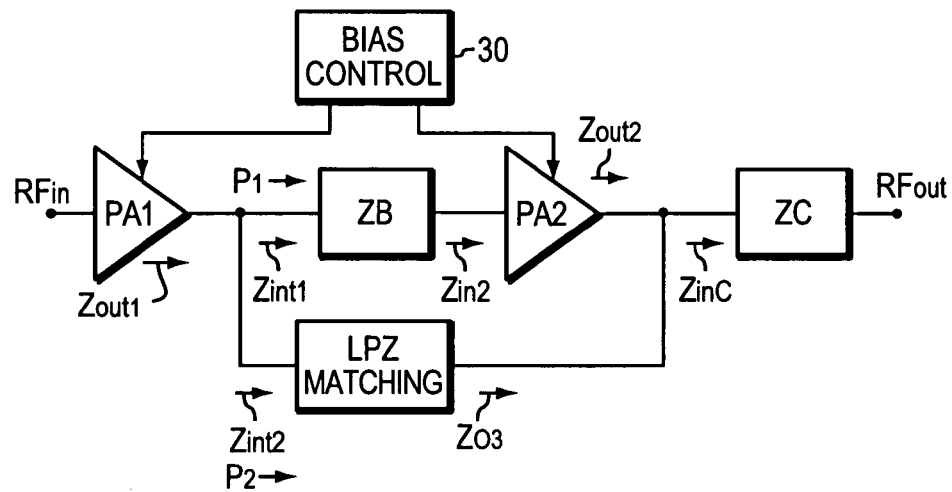
FIG. 5 is a circuit block diagram illustrating the present invention.
Figure 3:
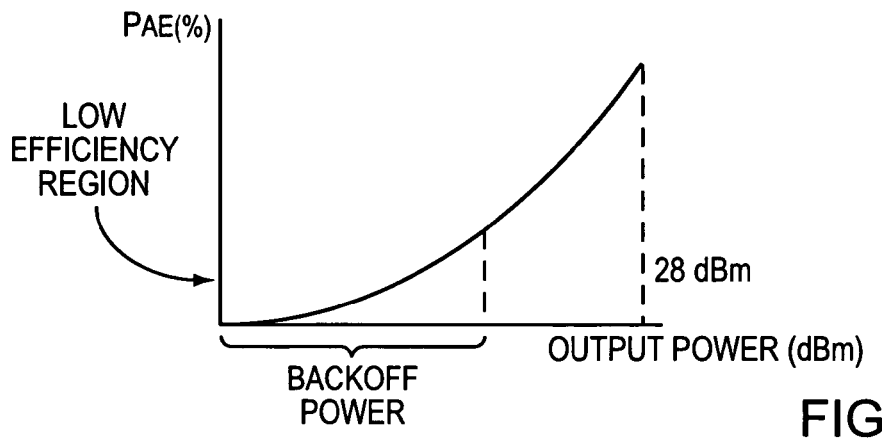
FIG. 3 is a trace illustrating efficiency of a power amplifier in the prior art utilizing a single power level mode.
Figure 4:
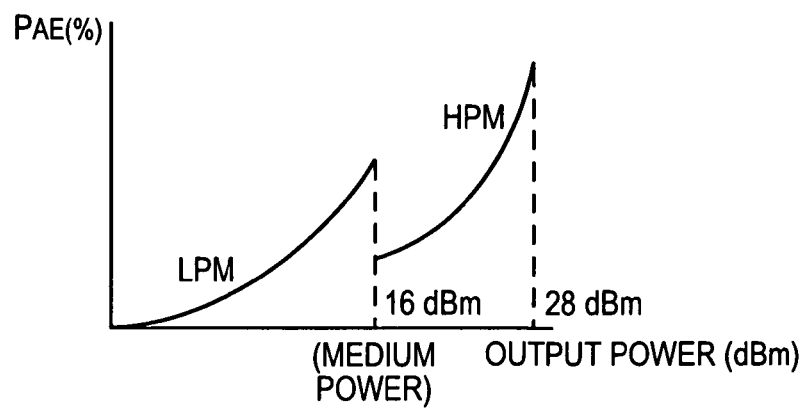
FIG. 4 is a trace illustrating efficiency of a power amplifier in the prior art utilizing two power level modes.

FIG. 5 illustrates a block diagram circuit incorporating an embodiment of the present invention. Comparing FIG. 5 with FIG. 1, two impedance matching circuits, the $1^{st}$ and the $3^{rd}$ in FIG. 1 are eliminated in FIG. 5. The bias control 30 sets the bias currents of both PA1 and PA2. In FIG. 5 a first path is via PA1, ZB, PA2 and ZC. A second path is via PA1, LPZ, and ZC. "First path" describe a path via which a higher power signal is is delivered to the output, while the "second path" transports a lower power signal. These designations are used to prevent confusion with HP and LP modes.

With respect to FIG. 5, in the LP mode, the bias control 30 biases PA2 off and sets the DC bias current of PA1 which is optimized for the best LP mode performances. However, in both the LP and the HP modes, the present invention is designed such that the power, P2, into the LPZ impedance matching circuit, is always higher than the power, P1, into the ZB impedance matching circuit. This is in direct contrast to the prior art, see items 20, 22 in FIG. 2. In order to accomplish this, in the LP mode, although Zint1 is smaller that Zint2, the phase angle of the Zint1 impedance is arranged to be near 180 degrees out of phase with the Zint2 impedance. This impedance arrangement is designed to set a nearly in-phase condition for the voltage and current waveforms to maximize power at the input of LPZ matching, and a nearly out-of-phase condition for the voltage and current waveforms to minimize power at the input of ZB. As a result, more power, P2, (70% in one embodiment) is delivered from PA1 to LPZ, and less power, P1, (30%) is delivered to ZB.

In HP mode, the load impedance, Zout1, presented to PA1 is lower than that of the LP mode. This is designed to increase the output power capability of PA1 such that sufficient power, via LPZ matching and PA2, is transferred to the ZC and then RFout. The bias control 30, in one preferred embodiment, changes the DC bias current of PA1 as compared to the LP mode, and biases PA2 on. The DC bias currents of both PA1 and PA2 are optimized for the best HP mode performances. In this case, Zout1 is designed to be equal to the parallel impedance of Zint1 and Zint2. In the HP mode, Zint2 is smaller than Zint1 and, in contrast to the LP mode, both Zint1 and Zint2 are arranged with near the same phase angle, so that a larger portion of the output power from PA1 (P1) is delivered to ZB than in the LP case, but P1 remains less than P2. The smaller portion of the output power from PA1, via impedance matching circuit ZB, is amplified by PA2. The total RFout power is the sum of the power from both of these paths. Note again that P2 delivered to the LPZ circuit is higher than P1 delivered to the ZB circuit in both the LP and the HP modes.

Figure 6:
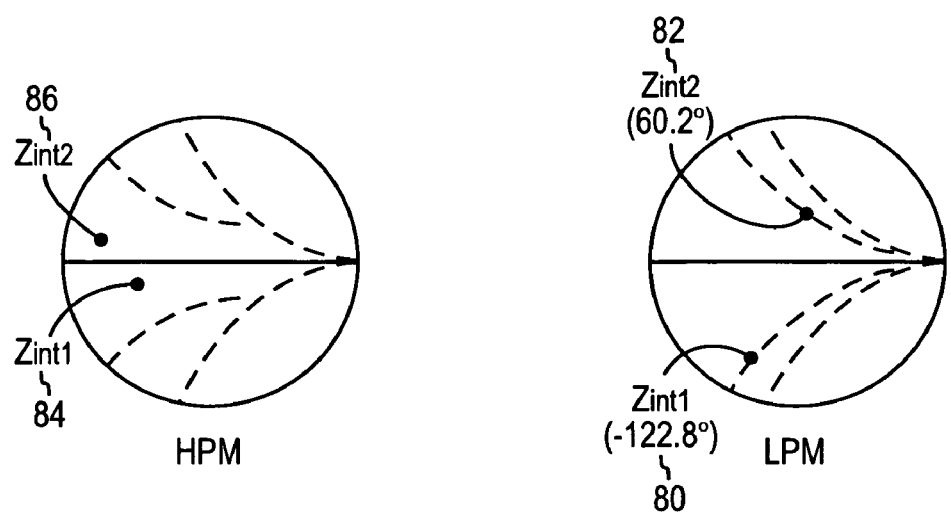
FIG. 6 is a simplified Smith Chart of some relative impedances in the HP and LP modes.

FIG. 6 illustrates the impedances of Zint1 and Zint2 in both the HP and LP modes. In the HP mode, these two impedances are nearly resistive with Zint2 smaller than Zint1. Zout1 is also resistive and is designed to present an optimum load impedance, through the parallel combination of Zint1 and Zint2, to PA1 such that sufficient power can be delivered by the PA1 for the HP mode. In the LP mode, Zint1 is smaller than Zint2 and both have significant reactive components. Zint1 has a capacitive component that provides a lag of about 122.8 degrees, while Zint2 has an inductive component that provides a lead of about 60.2 degrees. So, in the LPM there is about 180 degrees phase difference between these two impedances.

As mentioned above, in the LP mode, Zout1 and Zint2 are matched for the best power transfer from PA1 to the LPZ matching circuit. The impedance conditions are designed for a nearly in-phase voltage and current waveforms at the input of LPZ to maximize P2, and a nearly 90 degree out-of-phase voltage and current waveforms at the input of ZB to minimize P1. As a result, despite Zint2 is higher than Zint1, the power transferred to LPZ is higher than that to ZB.

Referring back to FIG. 5, in the LP mode, the bias control 30 shuts down PA2 and lowers the bias current of PA1 for optimum operation at the preset RFout power level of, in one embodiment, 16 dBm. In this case, the load impedance, Zout1, presented to PA1 is designed to be substantially higher than Zout1 in the HP mode, and to provide an optimum load impedance to PA1 for optimum RF performances and current consumption under LP mode (power backoff operation).

FIG. 7 shows relationships as disclosed in the Kim invention compared to those for the present invention. Rows 60, 66 and 68 are the only ones that are similar between Kim and the present invention. In particular compare items 58, 62, 64, and 70, where the requirements between Kim and the present invention are almost completely reversed. Item 74 is not mentioned in Kim. Furthermore, element 72, Zout1 (the impedance presented to PA1), in preferred embodiments, has a higher impedance level in the LP mode compared to the HP mode. This allows PA1 to experience a lower saturated power level in the LP mode operation. FIG. 7, item 74 provides impedance matching, in the LP mode, for substantially more power to be delivered from PA1 to the LPZ (the bypass circuit) than to ZB.

FIG. 8 lists some actual impedances at 1.95 GHz in an embodiment of the present invention. In the LP mode, Zint1 80 is 2.4−27j ohm and Zint2 82 is 57+36j ohm. These points are shown in FIG. 6. In the HP mode, Zint1 84 is 15.7−12.6j ohm, and Zint2 86 is 7.6+2.9j ohm. Here these complex impedances are nearly in phase for the HPM but nearly out-of-phase for the LPM as shown in FIG. 6. The input impedance of PA2, Zin2, is shown for both the LP and HP cases, as is Zout1, the load impedance presented to the output of PA1. Note from both FIGS. 7 and 8 that Zint2 is smaller than Zint1 in the HPM and larger in the LPM. Please note that LPM and LP mode are used interchangeably herein, as are HPM and HP mode.

Figure 9:
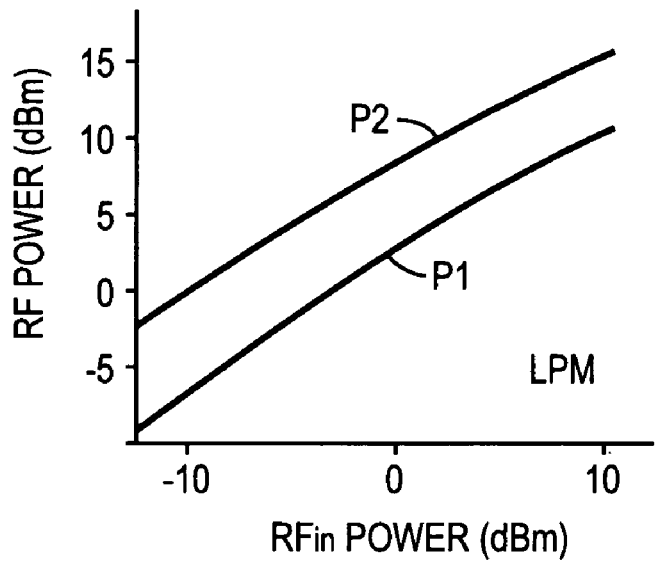
FIG. 9 shows the input power levels of the two parallel paths in the LP mode.
Figure 10:
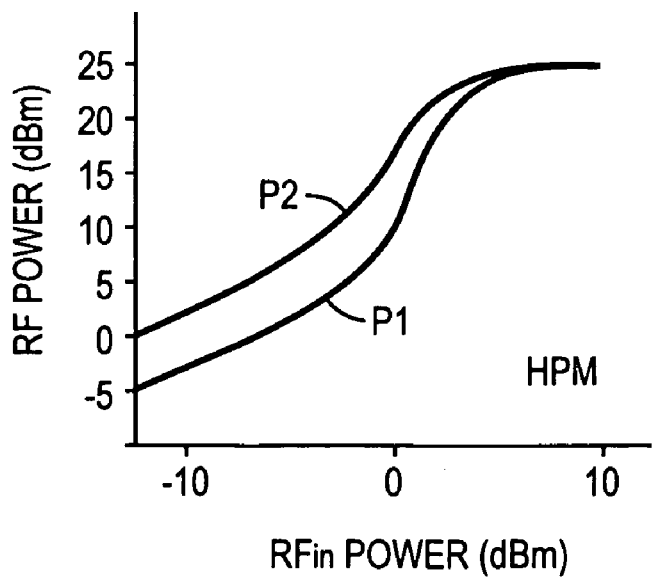
FIG. 10 shows the input power levels of the two parallel paths in the HP mode.

FIGS. 9 and 10 illustrate the power level of P1, the power into ZB, and P2, the power into LPZ for both the LP and HP modes for the present invention. Note that P2 is always higher than P1 for both modes. In the LP mode, the difference between P2 and P1 is about 6 dB. The difference between P2 and P1 in the HP mode is about 5 dB until P1 reaches 13 dBm (which corresponds to an RFout power of 28 dBm) where the difference decreases as a result of the complete power amplifier starting to enter into saturated operation.

Figure 11:
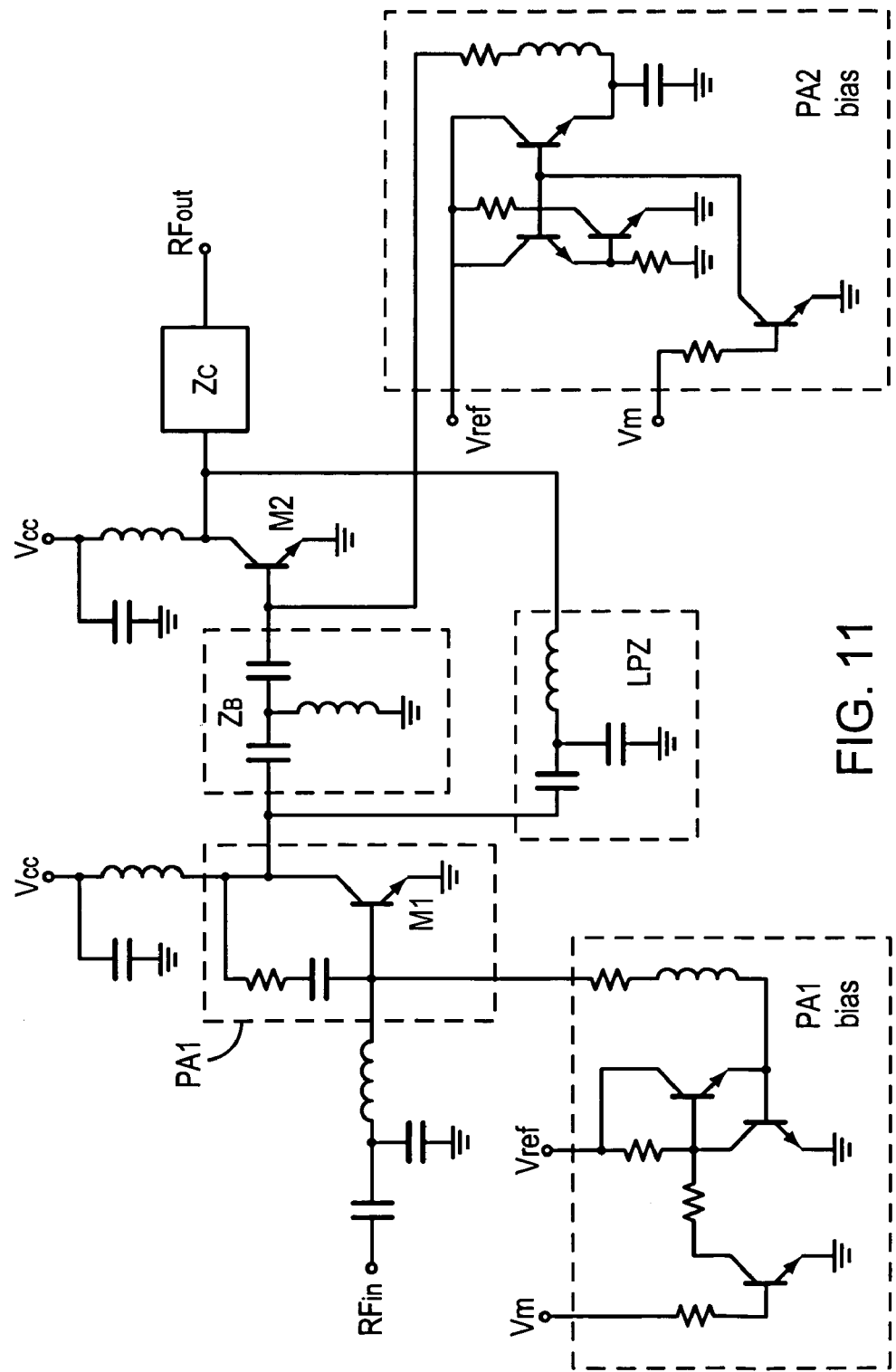
FIG. 11 is a simplified component schematic illustrating the types of circuits useful to implement the present invention.

FIG. 11 is a simplified schematic for a circuit implantation of FIG. 5. The bias mirror circuits for PA1 and PA2, LPZ, ZB, and PA1 and PA2 are illustrative. ZC is circuitry that provides the load impedance to the LPZ circuitry and the second power amplifier M2. In operation Vm sets the mode of the amplifier that biases the first power amplifier M1 and the second power amplifier M2 to accomplish the HP and the LP modes. In the LP mode, PA2 bias is arranged to turn off M2, while it turns on M2 in the HP mode, whereas PA1 bias is arranged to reduce the DC bias current for M1 compared to the HP mode. The DC bias currents for M1 under LP and HP modes are optimized for best performances in the corresponding mode of operation. Note that the biasing of M2 via the PA2 bias will modify the input and output impedance of M2 and, hence, ZB as well as LPZ. In this way the impedances are modified so as to change the proportions of power delivered to the first and the second paths when the mode is changed. For example, when the mode is changed from the HP to the LP mode, the biasing (PA2 bias) of M2 turns off M2 and alters the impedances such that minimal power is delivered to ZB from M1. Thus, in the LP mode, proportionally more power is delivered to LPZ, while in the HP mode the power delivered to ZB increases, though it still may not rise, in a preferred embodiment, to equal to the power to LPZ in the HP mode.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. An amplifier comprising:
    a first power amplifier,
    a first impedance matching circuit,
    a second power amplifier,
    a second impedance matching circuit, wherein a first path comprises the first power amplifier, the first impedance matching circuit, the second power amplifier, and the second impedance matching circuit,
    a bypass impedance matching circuit, wherein a second path comprises the first power amplifier, the bypass impedance matching circuit, and the second impedance matching circuit, and
    wherein when the amplifier is in a first mode, the impedances of the first and of the bypass impedance matching circuits are about equal, thereby about equally dividing the power flowing through each to an output, and, when the amplifier is in a second mode, power flows through the second path only to the output.

2. The amplifier of claim 1 wherein when the amplifier is in the second mode, the input impedance of the first and of the bypass impedance matching circuits are substantially different, thereby substantially more power is delivered to the bypass impedance matching circuit.

3. The amplifier of claim 1 wherein the power delivered to the bypass impedance matching circuits is greater than the power delivered to the first impedance matching circuit in both the first and the second modes.

4. The amplifier of claim 1 further comprising, when in the second mode, the first and the bypass impedance matching circuits have complex impedances that exhibit about 180 degrees phase difference.

5. The amplifier of claim 1 wherein the impedance change of the first and the bypass impedance matching circuits between the first and the second modes is effected by changing the biasing of the second power amplifier.

6. The amplifier of claim 1 wherein the first mode is where a higher power is output from the amplifier and the second mode is where a lower power is output from the amplifier, and wherein the input impedance of the first matching circuit is greater than the input impedance of the bypass impedance matching circuit in the first mode and less than the input impedance of the bypass impedance matching circuit in the second mode.

7. The amplifier of claim 1 wherein when the amplifier is in the second mode the second power amplifier is biased off.

8. The amplifier of claim 1 further comprising a bias circuit coupled to the second power amplifier, wherein the bias circuit, in response to a change in modes, changes the impedances of the second power amplifier.

9. The amplifier of claim 1 further comprising a bias circuit coupled to the first power amplifier, wherein the bias circuit, in response to a change in modes, changes the DC bias current of the first power amplifier.

10. The amplifier of claim 1 wherein the first mode is the high power mode and the second mode is the low power mode, and wherein the impedance and power relationships of claim 1 assume the relationships of:
    a) the input impedance of ZB, Zinti, is less than the input impedance of the LPZ MATCHING, Zint2, and the power delivered to the LPZ MATCHING, P2, is greater than the power delivered to ZB, P1, in the low power mode;
    b) the input impedance of ZB, Zinti, is greater than the input impedance of the LPZ MATCHING Zint2 and the power delivered to the LPZ MATCHING, P2, is greater than the power delivered to ZB, P1, P1, in the high power mode;
    c) the input impedance of PA2, Zin2(in the low power mode) is greater than 12 Zin2 (the input impedance of PA2 in the high power mode);
    d) the input impedance of ZB, Zint1(in the low power mode)is greater than the input impedance of ZB, Zint1 (in the high power mode);
    e) the input impedance of the LPZ MATCHING, Zint2(in the low power P 16 mode)is much greater than the input impedance of the LPZ MATCHING, Zint2(in the high power P mode);
    f) the output impedance of the power amplifier, PA2, Zout1 (in the low power P mode)is much greater than the output impedance of the power amplifier, PA2, Zout1 (in the high power mode); and
    g) the difference in phase of the input impedance of ZB, Zint1 and the input impedance of LPZ MATCHING, Zint2 in the low power mode is approximately 180 degrees.

* * * * *